United States Patent [19]

Luna

[11] 4,183,609
[45] Jan. 15, 1980

[54] INSULATOR BOARD FOR SPRING PROBE FIXTURES

[76] Inventor: L. Jack Luna, 1868 N. Calle Salto, Thousand Oaks, Calif. 91360

[21] Appl. No.: 887,038

[22] Filed: Mar. 16, 1978

[51] Int. Cl.² ............................................. G01R 15/12
[52] U.S. Cl. ........................... 339 R/176; 339/17 LC; 324/158 F
[58] Field of Search ................. 324/158 F; 339/17 C, 339/17 LC, 17 M, 18 R, 18 B, 18 P, 108 TP, 176 M, 176 MP, 255 R

[56] References Cited

U.S. PATENT DOCUMENTS

| | | | |
|---|---|---|---|
| 3,353,070 | 11/1967 | Paul et al. | 339/17 LC |
| 3,654,585 | 4/1972 | Wickersham | 339/17 M |
| 3,739,317 | 6/1973 | Wise | 339/255 R |
| 3,761,808 | 9/1973 | Ryan | 324/158 F |
| 4,061,969 | 12/1977 | Dean | 324/158 F |

OTHER PUBLICATIONS

IBM Technical Disclosure Bulletin; Millet et al; vol. 14, No. 12; May, 1972.
IBM Technical Disclosure Bulletin; Markewycz; vol. 15, No. 4; Sep., 1972.

*Primary Examiner*—Paul A. Bell
*Attorney, Agent, or Firm*—William W. Haefliger

[57] ABSTRACT

An insulator board for spring probe assemblies is formed by a method that includes: providing a board having upper and lower sections, drilling parallel openings through the sections, installing spring probe tubular housings in the openings, and contacting the sections and installed housings with synthetic resin and allowing the resin to cure to lock the housings to the sections.

12 Claims, 9 Drawing Figures

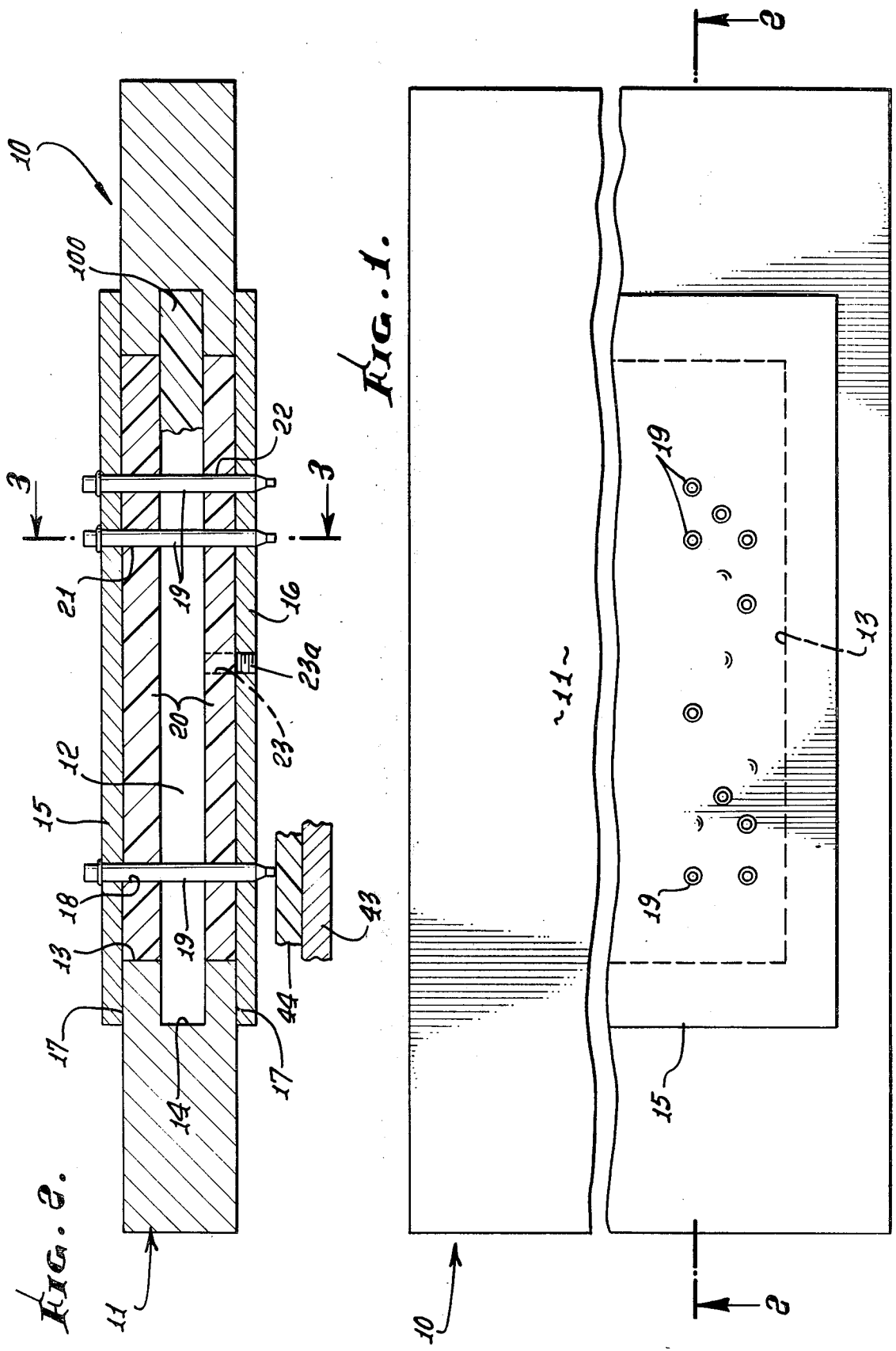

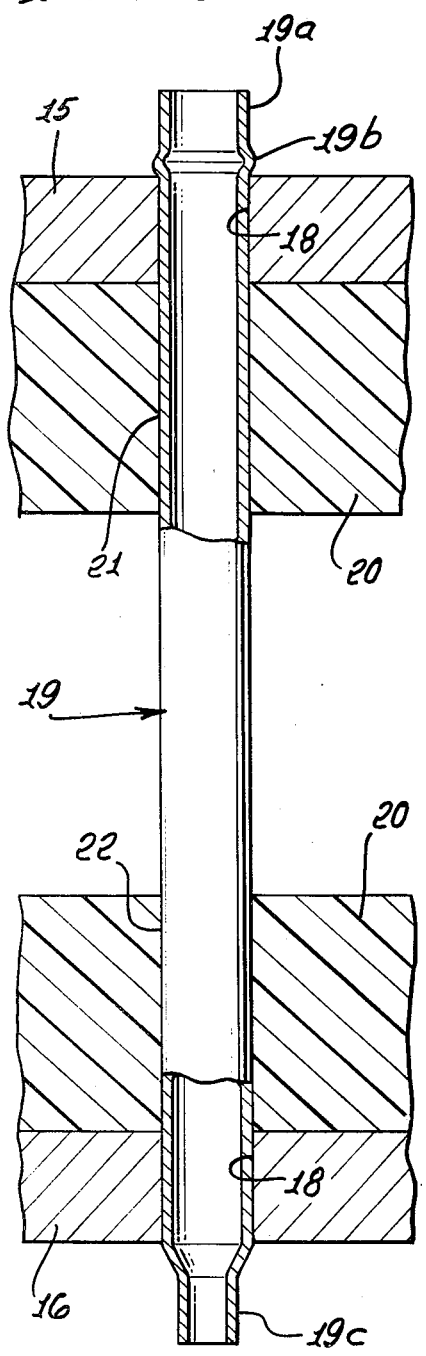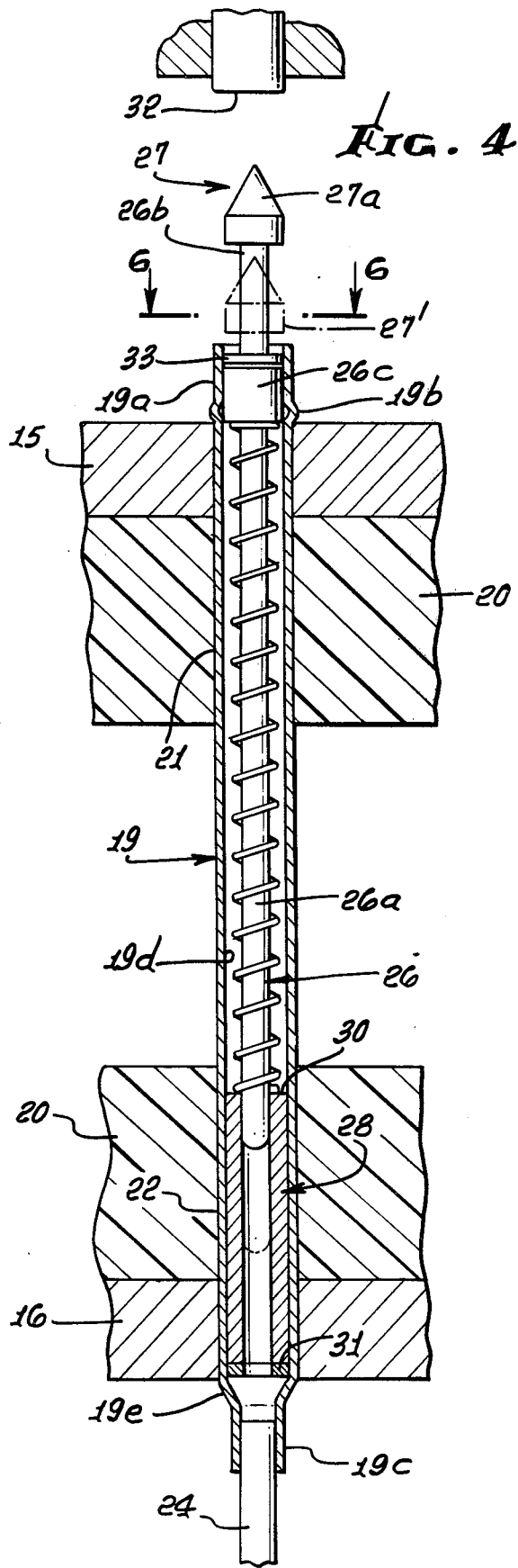

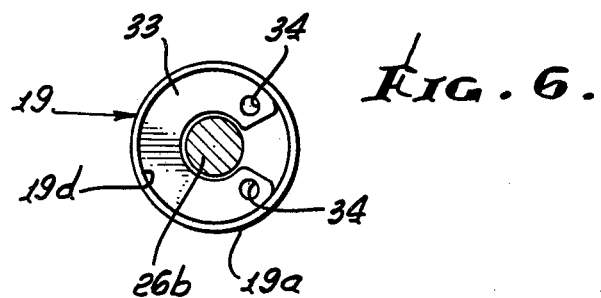
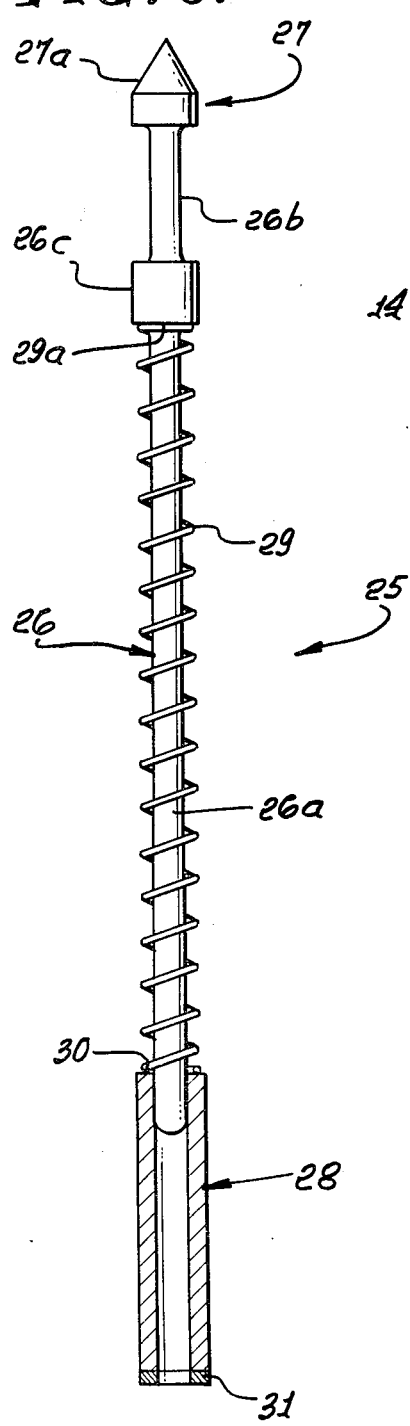
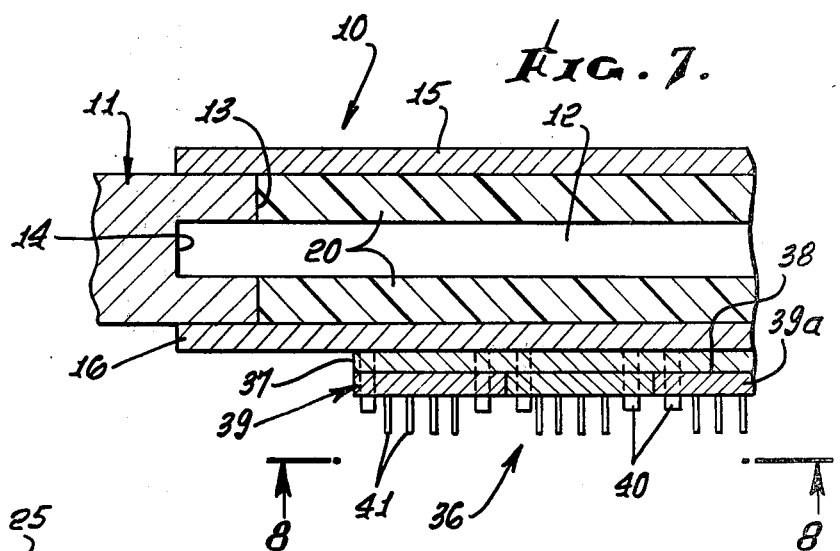
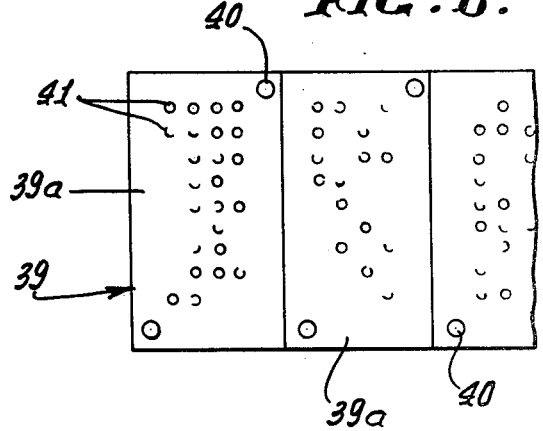
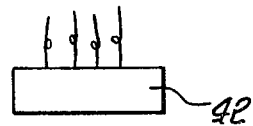

INSULATOR BOARD FOR SPRING PROBE FIXTURES

BACKGROUND OF THE INVENTION

This invention relates generally to testing of electronic circuitry, and more particularly concerns insulator boards to carry spring probe assemblies used in such testing.

In order to electrically test an electronic assembly, it is necessary to interconnect test points or circuits to appropriate connections on a test set. In testing printed circuit boards and other wired assemblies, this interconnection is usually accomplished through a "probing" operation. In its simplest form, probing is accomplished when a wire or probe is placed on a desired test point and a small amount of pressure is applied. Electrical contact is established and current flows through the probe to the test set and test results are observed.

In order to assure cost effective use of automated test equipment (ATE), it is often required to make hundreds or thousands of test point interconnections within a few seconds. This is accomplished through use of small device called a spring probe. As its name implies, a spring probe contains a spring and is used to probe electronic circuits. Basically, the spring mechanism allows the probe tip or plunger to be slightly displaced into the body of the probe when the test object is placed against the probe tip. Such spring action accomplishes two things:

(1) The spring tension applies the proper amount of force (2 to 4 oz. for example) to establish and maintain electrical connection with the contacted surface, and
(2) The probe tip displacement (0.125 inch for example) compensates for small irregularities in the surface area contacted.

As can be seen, any number of spring probes can be fixtured to any desired pattern and all can be engaged or disengaged through a single operation.

Spring probes are typically mounted in an insulator board in a pattern that corresponds to the geometry of the test object. Each desired test point has a probe and all probes are wired through a connector arrangement to a test set. The insulator board, spring probes and associated wiring are referred to as a "test fixture" because the pattern is fixed to the geometry of a particular test object. In general, insulator boards are removeable within a fixture so that multiple products can be tested with a common test set.

In the present art, insulator boards are constructed from heavy duty ½" to 1" phenolic material. Drilling small diameter holes in thick insulation material to receive spring probe assemblies creates three basic problems:

(1) Automatic NC drill machines cannot be used, as long, small diameter drills tend to bend or bow especially at drill speeds of automatic drill machines. A manual drill press is used instead, and fabrication costs increase very rapidly.
(2) Accuracy of hole locations using a manual drill press is very poor and frequently unacceptable. The inaccuracies of spot drilling are compounded by accumulated errors in using a travel dial across a wide (18") probe field.
(3) Small diameter, long length drills tend to wander or "drift" even at extremely slow drill rates. Hole diameters, therefore, are inaccurate and cause probe misalignment.

Excessive weight of such thick insulator boards is a further problem. Larger fixtures (24"×24" probe field) pose problems in operation as previously mentioned and create safety and damage hazards as well. In test operations, a fork lift is often times required to change probe heads or insulator boards. There is need for a comparable size insulator board which will weigh only approximately 25 to 30 pounds.

A further problem concerns the use of phenolic materials which have come into disfavor in the past few years because of their tendency to absorb moisture. This decreases leakage resistance between probes and causes insulator boards to expand and/or warp.

SUMMARY OF THE INVENTION

It is major object of the invention to provide an improved insulator board for spring probe assemblies that overcomes the above as well as other problems associated with prior boards, and in the manner as will be seen. Basically, the board comprises:

(a) upper and lower horizontal plates which are vertically spaced apart,
(b) vertically extending tubular housings to receive spring probe assemblies, the housings extending through bores formed in the plates and the housings operatively connected to the plates, and
(c) insulative material between the plates and bonded to intermediate portions of the housings between the plates.

As will be seen, the insulative material may advantageously include upper and lower horizontal layers, the former bonded to the underside of the upper plate and the lower layer bonded to the upper side of the lower plate; further, such layers may comprise synthetic resin such as epoxide resin cured in situ against the plates, and forming a spaced therebetween as a result of resin pouring or injection in the manner to be described; and spring probe assemblies may then be very conveniently inserted into the fixed tubular housings, and removed therefrom, as required.

Further, the boards typically include support frames machined from ½" or ¾" (for example) standard stock aluminum material. Machining consists in forming "cut-out" sections with an undercut or groove, the cut-out area (together with configurator boards) providing a mold for casting the spring probes or sockets in the epoxy material. The groove provides added structural support when the epoxy is poured and cured. Configurator boards or plates may be produced from standard printed circuit board (PCB) epoxy fiberglass material. Drill tapes originally used to configure the test objects may be used to automatically configure the boards, using computer controlled drill equipment.

The boards or plates are installed over the top and bottom of the support frame opening, and are aligned with tooling pins through tooling holes in the PCBs. The boards are temporarily secured to the support frame to facilitate probe or socket installations.

The spring probes or sockets are typically installed in the insulator board by press fitting them through the two configurator boards. When all probes are installed, the epoxy mixture is "injected" in the cut-out mold and is allowed to cure. The result is an inexpensive, lightweight insulator board with extremely accurate hole positioning and good electrical insulation properties.

Accordingly, from what has been said, a primary purpose of the invention is to provide a simple and inexpensive means of manufacturing insulator boards for spring probe fixtures. The method developed is especially useful where close center line spacing (0.050 inch) is required and true positioning of probes is critical. The primary function of an insulator board is to position and hold spring probe assemblies in a pattern that corresponds to desired test points on a test object. Although the function is simple, there are several important considerations in insulator board design and construction. Major considerations are outlined below:

ACCURACY OF HOLE POSITIONING

The accuracy of hole positioning is of paramount importance in insulator board production. Holes or probes must be exactly positioned relative to the test objects tooling pin holes to insure proper and continuous operations of the probe fixtures in intended use.

INSULATION RESISTANCE

The electrical resistivity of the insulator board material is also of basic importance, expecially in high voltage (HI-POT) test applications where hundreds of millions of ohms are measured. Leakage resistance of the insulator material can adversely affect these test measurements and provide erroneous and misleading information. Such leakage resistance is between adjacent probes and becomes more evident as probe spacing becomes smaller.

STRUCTURAL STRENGTH

Insulator boards are subjected to thousands of pounds of force when several thousand spring probes are fixtured and engaged. Such force is centered within a small area of the spring probe field and tends to bend or deflect the insulator board when applied. Therefore, board strength is important.

BOARD THICKNESS

Thickness of the insulator board is dictated by the above structural problem. The number of probes and density is increasingly proportional to insulator board thickness. As the probe density increases, the insulator board's structural properties are decreased due to holes drilled. This and the added probe force increases board thickness.

WEIGHT

Due to the strength and thickness required, insulator board weight becomes a problem where large test objects are fixtured. A 24"×24" probe field with several thousand probes can weigh as much as a hundred pounds or more when phenolic type materials as used. Frequent handling or changing insulator boards within a fixture creates problems in test operations.

CENTER LINE SPACING

The minimum center line spacing between probes has become increasingly important in recent years due to the general trend in the electronics industry. This trend is more and more towards miniaturization of both components and packaging which places test points or probes closer together. As the probes becomes closer, the holes become smaller and probe densities are increased. As can be seen, a chain reaction takes place in that board thickness, weight, etc. are affected. This accounts for the wide price difference (3 to 1) between 0.050 inch and 0.100 inch centers in present designs.

Although the primary purpose of this invention is to reduce construction costs of insulator boards, the design has many decided technical advantages over conventional fixtures. These advantages are summarized below and are compared with the present art in the following description.

(a) Construction cost is drastically reduced as a result of automation in the hole drilling process and lower material cost.
(b) Insulation resistance and structural strength are improved through use of the aluminum and epoxy fiberglass materials.
(c) Configuration board thickness is reduced to about 1/16" for hole drilling purposes.
(d) Weight is approximately ¼ that of conventional designs.
(e) Center line spacing of holes can be as low as 0.025" without affecting cost or production since holes are automatically drilled through thin PCB material.

Hole accuracy is always maintained through enabled use of a modern automatic NC drill machine. Hole positioning is assured within +0.001 inch of its true position.

These and other objects and advantages of the invention, as well as the details of illustrative embodiment, will be more fully understood, from the following description and drawings, in which:

DRAWING DESCRIPTION

FIG. 1 is a plan view of an insulator board embodying the invention;
FIG. 2 is a section on lines 2—2 of FIG. 1;
FIG. 3 is an enlarged section taken in elevation on lines 3—3 of FIG. 2;
FIG. 4 is a view like FIG. 3, but showing a retrievable spring probe assembly in a barrel as shown in FIG. 3;
FIG. 5 is an elevation showing the retrievable spring probe assembly prior to insertion in the barrel of FIG. 3;
FIG. 6 is a plan view on lines 6—6 of FIG. 4; and
FIG. 7 is a section like that of FIG. 2, showing a modification;
FIG. 8 is an elevation taken on lines 8—8 of FIG. 7 and;
FIG. 9 is a view of a test set.

DETAILED DESCRIPTION

In FIGS. 1 and 2, an insulator board 10 includes a frame 11 which may be rectangular, and which defines a central, typically rectangular, opening 12. In this regard, the frame inner periphery 13 may be recessed as at 14, the recess extending about the opening 12.

The board 10 also includes upper and lower horizontal plates 15 and 16 which are vertically spaced apart. Such plates may be suitably attached to the upper and lower flat sides of the frame, as at 17. The plates may be electrically insulative.

Openings or bores 18 are drilled or formed in the plates to receive vertically extending tubular housings 19, which are in turn adapted to receive the spring probe assemblies to be described. The housings may for example have press fit attachment to the plates, at bores 18. In addition, the housings preferably are secured in position by insulative material 20 located between the plates and bonded to intermediate portions of the housings, as at locations 21 and 22. Material 20 may advantageously consist of synthetic resin such as epoxy resin formed in vertically spaced layers as shown. The lower layer may be formed first, as by applying resin against the innerside of lower plate 16. After curing of the lower layer, the board may be inverted, and an opening 23 formed in the lower layer 20. Resin may then be passed through that opening and against the innerside of plate 15 (in lower position) whereby the upper layer 20 is formed. Opening 23 may then be plugged as at 23a. If necessary, a corresponding opening may be formed in plate 15 to inject resin to form the layer 20 adjacent plate 16. Accordingly, all the tubular housings 19 are rigidly attached to the board 10. If desired, the resin may be filled into space 12 to fill recess 14 and lock to the frame, as at 100 in FIG. 2.

Extending the description to FIGS. 3 and 4, it will be seen that the barrel or housing 19 typically protrudes at 19a above the upper plate. Further, an expanded ring portion 19b of the barrel engages the top of the plate 15 to limit downward initial insertion or reception of the barrel 19 into the plate 15 and 16. The lowermost portion 19c of the barrel is reduced in cross section to receive an interconnection, such as a wire wrap pin 24, or other connection via which a wire connection is made to another terminal, as will be described.

Referring to FIG. 5, the spring probe assembly or sub-assembly 25 includes a vertically elongated plunger 26 characterized by a vertically and axially elongated lower section 26a, and a vertically and axially elongated upper section 26b. The latter is substantially shorter than the former, and separated therefrom by a cylindrical enlargement 26c integral with the plunger. The enlargement is sized to wipe-contact the bore 19d of the tubular housing, affording an electrical contact path between the plunger and enclosure as the plunger moves up and down in the enclosure. A contact head 27 is integral with the plunger at its upper end, and includes a tapered end portion 27a adapted to engage an electrical contact to be tested. The head, plunger and enlargement may all consist of electrically conductive material such as aluminum, copper, etc. Sections 26a and 26b are of reduced diameter in order to avoid rubbing contact with bore 19d, thereby reducing frictional resistance to movement of the plunger.

A vertically elongated guide sleeve 28 receives the lowermost portion of the plunger, to have wipe-contact therewith, and a compression spring 29 is received on plunger portion 26a to tend to urge the plunger and sleeve in relatively opposite directions. In this regard, the spring and sleeve may also consist of electrically conductive material to provide additional electrical paths between the plunger and enclosure 19. The upper end of the spring typically engages the lower portion of the enlargement, i.e. at 29a, and the lower end of the spring typically engages the upper end of the sleeve, at 30.

The sleeve also has close sliding fit, i.e. electrical contact, with the enclosure bore 19d, as seen in FIG. 4. Also, a small ring 31 may be located at the lower end of the sleeve, and may tightly engage bore 19e to act as a stop engaged by the bottom end of the sleeve. In this regard, the reducing, i.e. tapered, lower end portion 19d of the enclosure locates the ring, or the lower end of the sleeve in case the ring is omitted. Spring 29 serves to urge the probe plunger toward up-position as seen in solid lines in FIG. 4. A contact is shown at 32 to be relatively displaced toward the head, urging it downwardly toward lower position indicated by broken lines 27'.

An important feature concerns the provision of means 33 at one end, (i.e. the upper end for example) of the housing 19 to releasably retain the enlargement 26c in the housing, whereby the probe in uppermost position remains urged upwardly by the spring 29. Also, the probe sub-assembly 25 as shown in FIG. 5 is easily removed from the housing 19, for replacement or repair, after simple removal of the means 33 from the housing. The means 33 may advantageously comprise a C-ring tightly fitting the bore 19d of the housing, as is clear from FIG. 6. Ring 33 has loose sliding fit with plunger upper section 25b. If desired, a small annular recess may be formed in bore 19d to receive the outermost portion of the ring. The ring is easily removed from the bore as by a tool interfitting small openings 34 in the ring ends, whereby the ring may be radially inwardly deflected to disengage bore 19d.

FIGS. 7 and 8 illustrate terminal means 36 to which the wire wrap pins 24 may be connected, as by hand wiring, and to which the other electrical circuitry may be connected. Such means may include a "mother board" 37 attached as by bonding at 38 to lower plate 16, and terminal modules 39 attached to board 37. Located pins 40 may be carried by board 37 to penetrate corresponding locating openings at the corners of the module plates 39a. The latter typically carry rows and columns of terminal pins 41, to which pins 24 are wired. The precise location of the pins 41 enables programmed connections of wires to them, as by known wire wrap machines.

Pins 41 may be appropriately wired to a test set, indicated at 42 in FIG. 9.

FIG. 2 also shows the support of housing 19 as by plates 43 and 44, as during application of loads from multiple contacts. Accordingly, loading is not transferred to the frame 11.

I claim:
1. In an insulator board for spring probe assemblies,
   (a) upper and lower horizontal plates which are vertically spaced apart,
   (b) vertically extending tubular housings to receive spring probe assemblies, the housings extending through bores formed in the plates and the housings operatively connected to the plates, and
   (c) insulative material associated with at least one of the plates and bonded to portions of the housings adjacent at least one plate, said material extending in at least one layer bonded to a side of at least one plate.

2. The board of claim 1 wherein said insulative material includes upper and lower horizontal layers, the upper layer bonded to the underside of the upper plate, and the lower layer bonded to the upperside of the lower plate.

3. The board of claim 2 wherein the upper and lower insulative layers comprise cured synthetic resin forming a space therebetween.

4. The combination of claim 3 including an opening through at least one of said plates to pass uncured flowable synthetic resin into the space between the plates.

5. The combination of claim 4 wherein said opening also extends through one of said layers.

6. The board of claim 1 wherein the board includes a metallic frame carrying said upper and lower plates.

7. The combination that includes the board of claim 1 and spring probe assemblies in said housings.

8. The combination of claim 7 including wire wrap terminal pins attached to the lower ends of said housings, there being means at the upper end portions of the housings removably retaining said spring probe assemblies in the housings.

9. The combination of claim 7 wherein said probe assemblies include plungers in sliding contact with bores formed by the housings.

10. The combination of claim 1 including wire wrap terminal pins attached to lower ends of said housings.

11. The board of claim 1 wherein said housings have press fit with said plate bores.

12. In an insulator board for spring probe assemblies,
(a) upper and lower horizontal plates which are vertically spaced apart,
(b) vertically extending tubular housings to receive spring probe assemblies, the housings extending through bores formed in the plates and the housings operatively connected to the plates, and
(c) insulative material associated with the plates and bonded to portions of the housings adjacent surfaces defined by at least one of the plates,
(d) the board including a metallic frame carrying said upper and lower plates,
(e) the board forming a central opening and having an inner periphery, said periphery being outwardly recessed to receive said insulative material.

* * * * *